(12) United States Patent
Levinski

(10) Patent No.: US 12,140,859 B2
(45) Date of Patent: Nov. 12, 2024

(54) OVERLAY TARGET DESIGN FOR IMPROVED TARGET PLACEMENT ACCURACY

(71) Applicant: KLA Corporation, Milpitas, CA (US)

(72) Inventor: Vladimir Levinski, Migdal Ha'emek (IL)

(73) Assignee: KLA Corporation, Milpitas, CA (US)

( * ) Notice: Subject to any disclaimer, the term of this patent is extended or adjusted under 35 U.S.C. 154(b) by 96 days.

(21) Appl. No.: 17/769,054

(22) PCT Filed: Apr. 7, 2022

(86) PCT No.: PCT/US2022/023751
§ 371 (c)(1),
(2) Date: Apr. 14, 2022

(87) PCT Pub. No.: WO2023/113850
PCT Pub. Date: Jun. 22, 2023

(65) Prior Publication Data
US 2023/0194976 A1    Jun. 22, 2023

Related U.S. Application Data

(60) Provisional application No. 63/290,651, filed on Dec. 17, 2021.

(51) Int. Cl.
*G03F 1/42* (2012.01)
*G03F 7/00* (2006.01)
*H01L 21/027* (2006.01)

(52) U.S. Cl.
CPC ............ *G03F 1/42* (2013.01); *G03F 7/70633* (2013.01); *G03F 7/70683* (2013.01); *H01L 21/0274* (2013.01)

(58) Field of Classification Search
CPC ..... G03F 1/42; G03F 7/70633; G03F 7/70683

USPC ............................................................ 430/5
See application file for complete search history.

(56) References Cited

U.S. PATENT DOCUMENTS

| | | |
|---|---|---|
| 10,228,320 B1 | 3/2019 | Levinski et al. |
| 2017/0153558 A1 | 6/2017 | Tel et al. |
| 2019/0049373 A1 | 2/2019 | Levinski |
| 2019/0250504 A1 | 8/2019 | Feler et al. |
| 2020/0348605 A1 | 11/2020 | Mathijssen et al. |
| 2021/0026238 A1 | 1/2021 | Xiao |
| 2021/0149296 A1 | 5/2021 | Feler et al. |
| 2021/0389125 A1 | 12/2021 | Volkovich et al. |

OTHER PUBLICATIONS

WIPO, International Search Report for International Application No. PCT/US2022/023751, Sep. 6, 2022.

*Primary Examiner* — Christopher G Young

(74) *Attorney, Agent, or Firm* — Hodgson Russ LLP

(57) ABSTRACT

A method for semiconductor metrology includes depositing a first film layer on a semiconductor substrate and a second film layer overlying the first film layer. The first and second film layers are patterned to create an overlay target having a specified geometrical form by using a projection system having a predefined resolution limit to project optical radiation onto the semiconductor substrate through at least one mask. The mask contains target features having target feature dimensions no less than the predefined resolution limit in an arrangement corresponding to the specified geometrical form of the overlay target and assist features interleaved with the target features and having at least one assist feature dimension that is less than the predefined resolution limit.

18 Claims, 5 Drawing Sheets

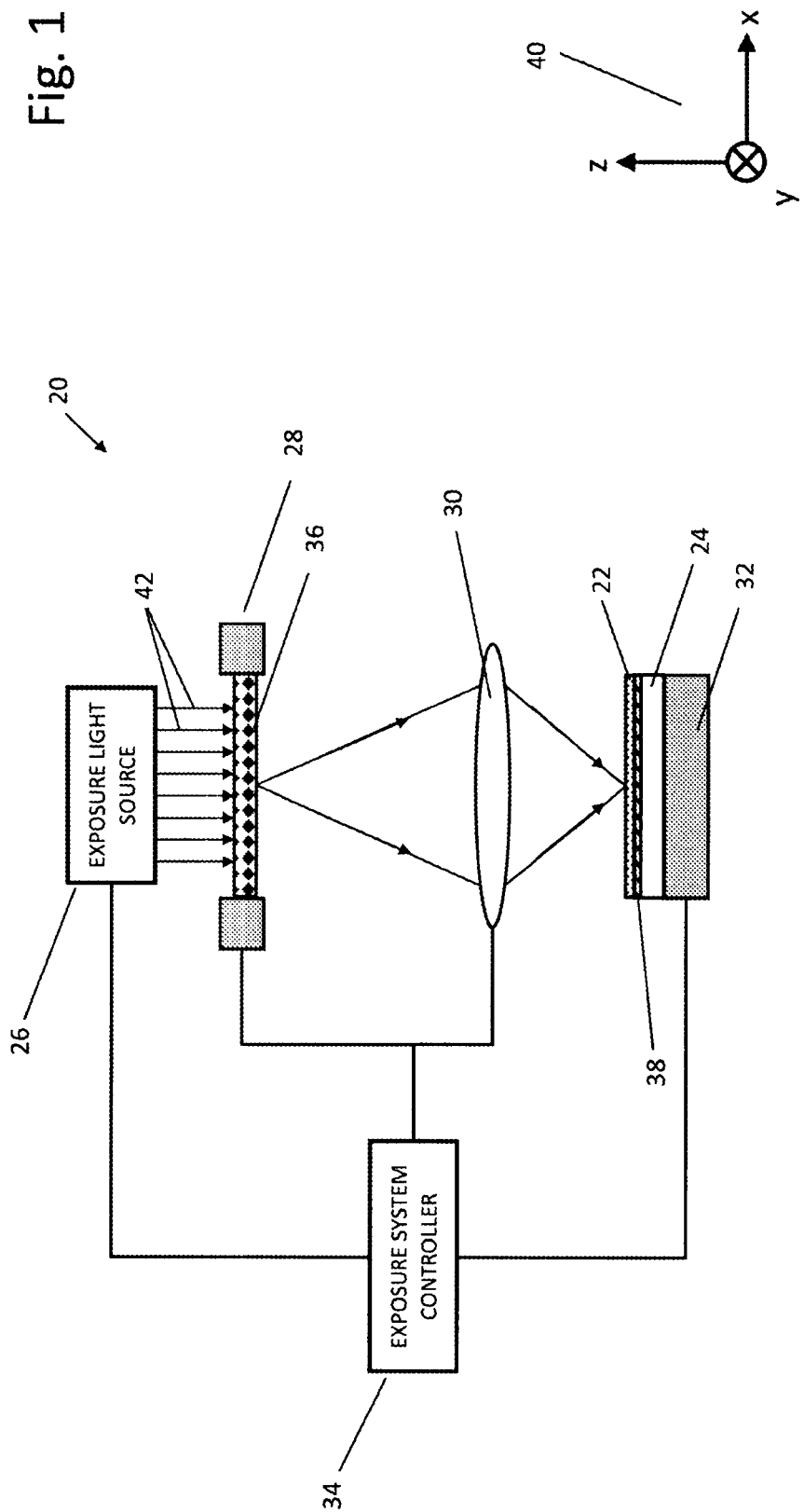

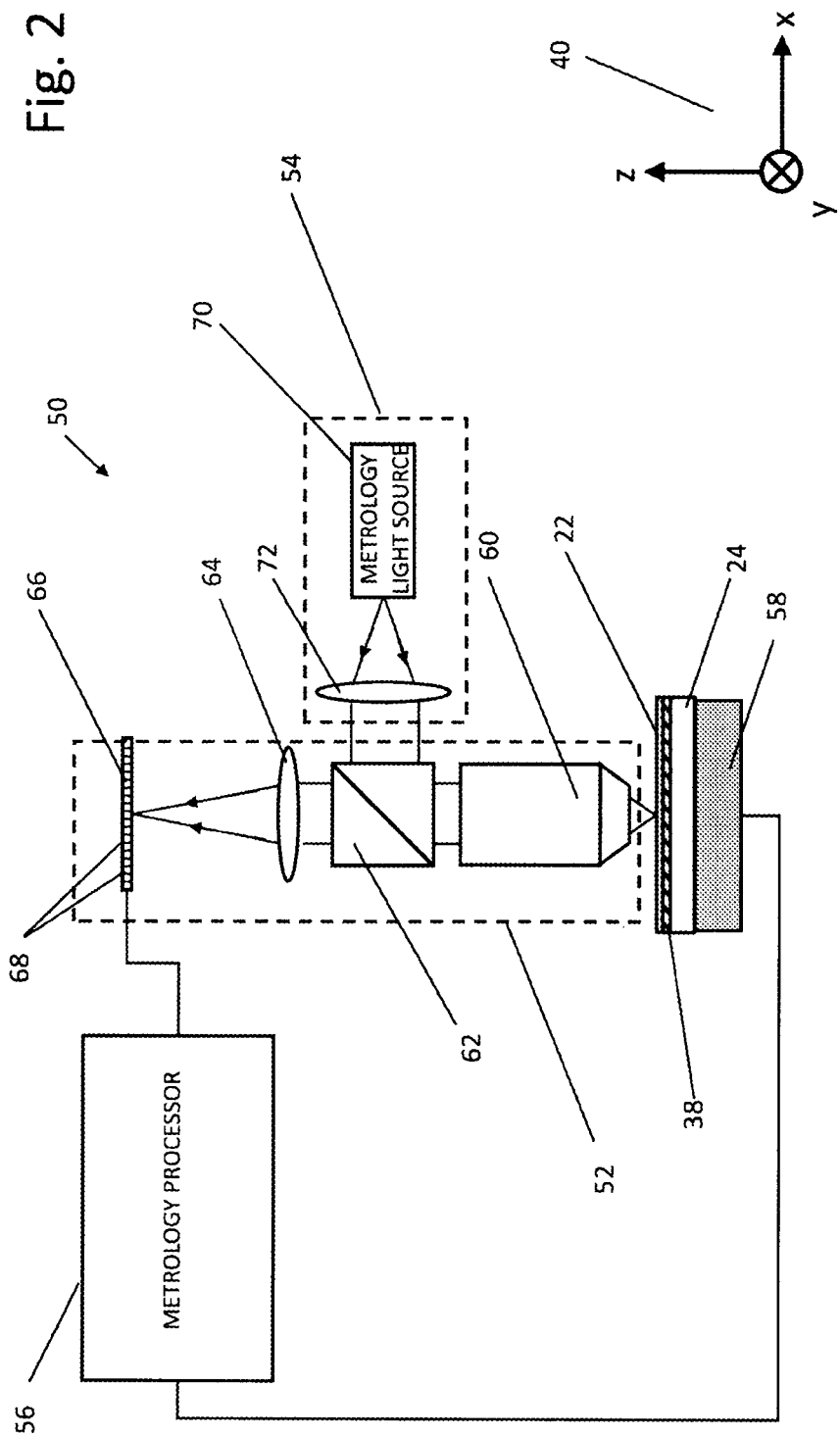

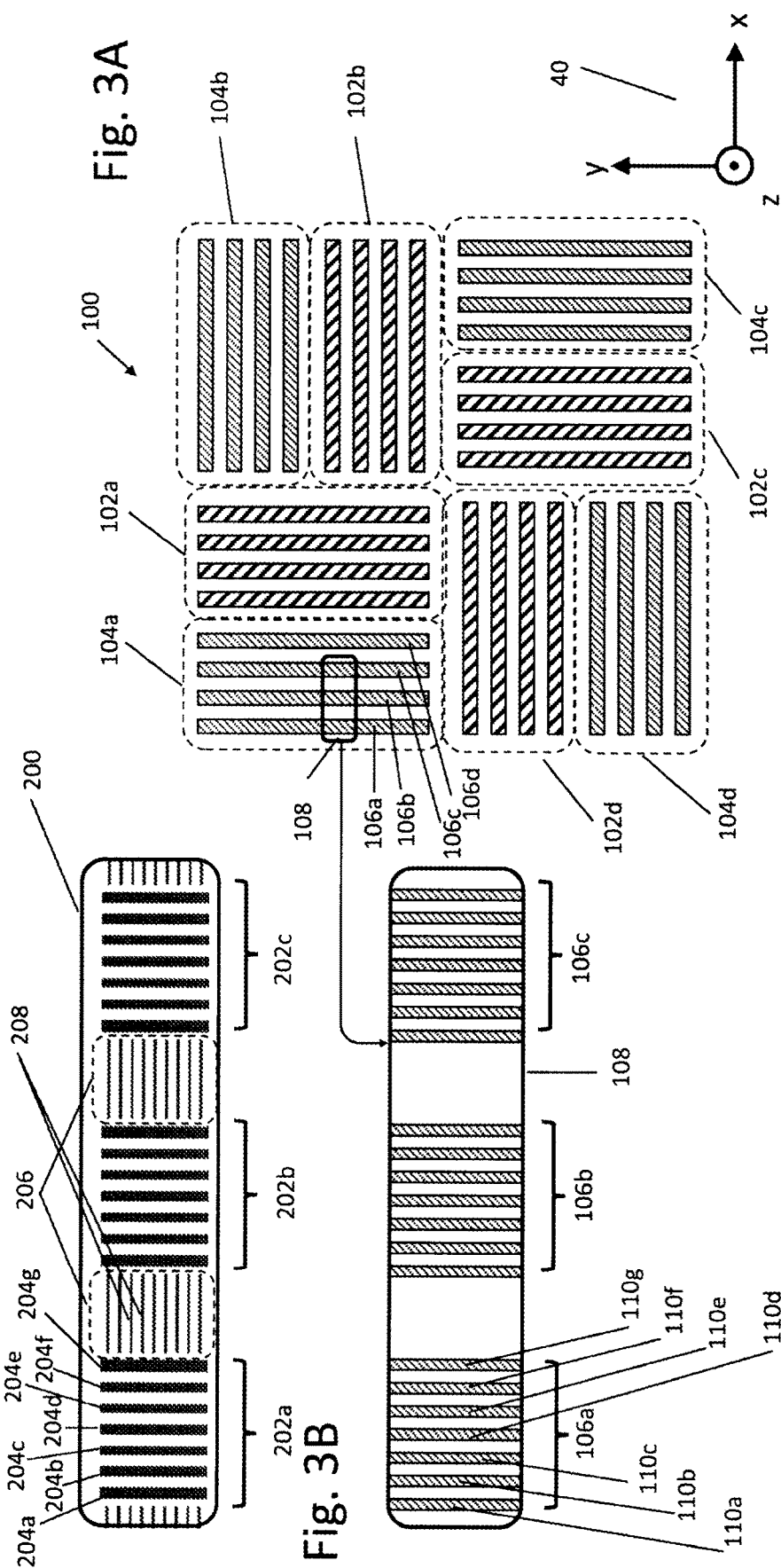

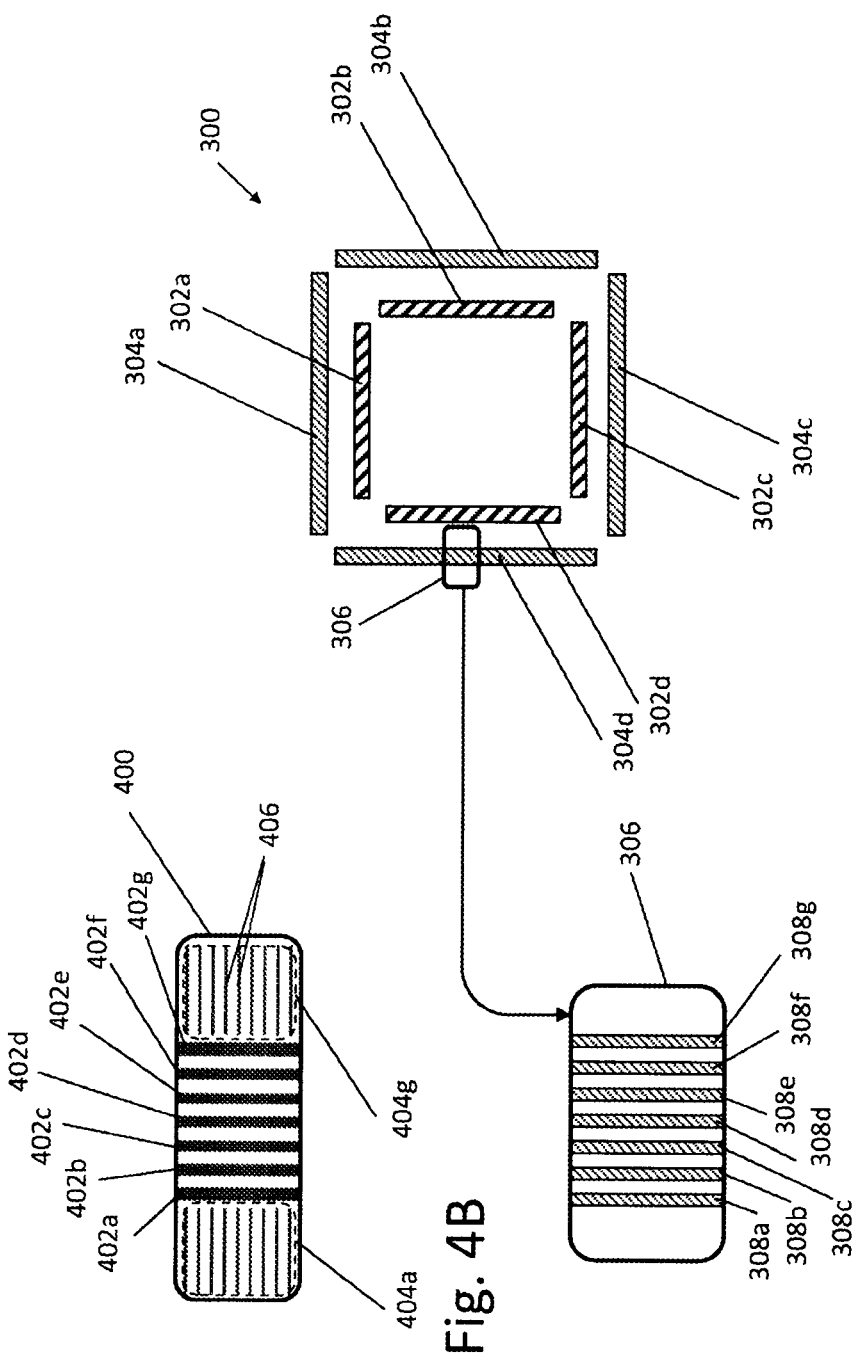
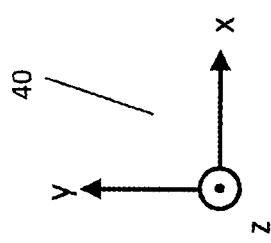

OVERLAY TARGET DESIGN FOR IMPROVED TARGET PLACEMENT ACCURACY

CROSS-REFERENCE TO RELATED APPLICATION

This application claims the benefit of U.S. Provisional Patent Application 63/290,651, filed Dec. 17, 2021, which is incorporated herein by reference.

FIELD OF THE INVENTION

The present invention relates generally to manufacture of semiconductor devices, and particularly to methods and target features for semiconductor circuit metrology.

BACKGROUND

Semiconductor circuits are commonly manufactured using photolithographic methods. In the photolithographic process, a thin layer of a photosensitive polymer (photoresist) is deposited over a semiconductor substrate. The photoresist is patterned by an exposure system, typically comprising a scanner or a stepper, which projects an image of a mask (also termed a "photomask" or "reticle") onto the photoresist, typically using ultraviolet (UV) or extreme ultraviolet (EUV) radiation. After patterning, the substrate is modified by methods such as etching and ion bombardment to change the material properties and/or the topography of the substrate, while the parts of the substrate covered by the photoresist are not affected.

Semiconductor circuit metrology is used for measuring properties of the patterned photoresist, such as the topography and location of the patterned features. Accurate location of the patterned features of the photoresist with respect to previously patterned process layers is crucial for achieving a high yield of the photolithographic process. Any error in the registration (misregistration) of the patterned photoresist with respect to an underlying process layer is referred to as "overlay error." As an example, in typical semiconductor circuits with minimum line-widths (critical dimensions, CDs) of 10-14 nm (so-called 10-nm design rule), the maximal permissible overlay error is 2-3 nm. In leading-edge semiconductor circuits, the line-widths are shrinking to 5 nm, with a concomitant reduction in maximal permissible overlay error.

Overlay error is commonly measured using optical overlay metrology apparatuses (commonly called optical overlay metrology tools), as optical radiation in the visible and infrared wavelengths is capable of penetrating through the photoresist layer, as well as through dielectric layers under the photoresist. Furthermore, infrared wavelengths are capable of penetrating a semiconductor substrate, such as silicon, enabling metrology through the substrate. The overlay error is measured from overlay targets located in the scribe lines of the semiconductor substrate (the lines separating adjacent dies) and/or within the dies.

Commonly used overlay metrology tools fall into two categories: scatterometry tools and imaging tools. Scatterometry tools, such as the ATL100™ tool by KLA Corporation (Milpitas, CA, USA), capture a diffracted (scatterometric) image of periodic target features of the overlay target from the exit pupil of the objective lens of the metrology tool. The scatterometric image, indicative of the angular distribution of the optical radiation that is scattered from the target features, is processed in order to measure the overlay error.

Imaging tools, such as the Archer™-series tools by KLA Corporation, image an overlay target, such as AIM™ overlay target by KLA. An image analysis algorithm is applied to the acquired images in order to locate the center of symmetry of the target features in the process layer and the center of symmetry of the target features in the photoresist layer. The overlay error is computed based on the displacement between the centers of symmetry of the target features in the two layers.

The terms "optical radiation" and "light," as used in the present description and in the claims, refer generally to any and all of visible, infrared, ultraviolet, and extreme ultraviolet radiation.

SUMMARY

Embodiments of the present invention that are described hereinbelow provide improved methods and systems for patterning overlay targets.

There is therefore provided, in accordance with an embodiment of the invention, a method for semiconductor metrology, which includes depositing a first film layer on a semiconductor substrate and a second film layer overlying the first film layer. The method further includes patterning the first and second film layers to create an overlay target having a specified geometrical form by using a projection system having a predefined resolution limit to project optical radiation onto the semiconductor substrate through at least one mask. The mask contains target features having target feature dimensions no less than the predefined resolution limit in an arrangement corresponding to the specified geometrical form of the overlay target, and assist features interleaved with the target features and having at least one assist feature dimension that is less than the predefined resolution limit.

In a disclosed embodiment, the specified geometrical form includes multiple parallel, equispaced bars. Alternatively, the specified geometrical form includes a frame-in-frame target.

In some embodiments, the target features include multiple parallel linear segments oriented along a first direction, and the assist features include linear gratings oriented along a second direction, which is not parallel with the first direction. In a disclosed embodiment, the second direction is perpendicular to the first direction. Additionally or alternatively, the at least one mask further includes circuit features having a predefined critical dimension, and the linear segments have respective widths equal to the predefined critical dimension. In a disclosed embodiment, the multiple parallel linear segments are grouped together to define at least one bar, and the assist features are disposed on both sides of the at least one bar. Further additionally or alternatively, the multiple parallel linear segments are grouped together to define multiple parallel bars, and the assist features are disposed between the multiple parallel bars. In some embodiments, the linear gratings of the assist features have a pitch less than 10 nm.

There is also provided, in accordance with an embodiment of the invention, a mask for patterning a semiconductor wafer in a photolithographic projection system having a predefined resolution limit, wherein the mask includes a transparent substrate and features disposed on the transparent substrate. The features include target features having target feature dimensions no less than the predefined resolution limit in an arrangement corresponding to a specified geometrical form of an overlay target, and assist features interleaved with the target features and having at least one assist feature dimension that is less than the predefined resolution limit.

The present invention will be more fully understood from the following detailed description of the embodiments thereof, taken together with the drawings in which:

BRIEF DESCRIPTION OF THE DRAWINGS

FIG. 1 is a schematic side view of an exposure system for patterning a photoresist layer on a semiconductor substrate, in accordance with an embodiment of the invention;

FIG. 2 is a schematic side view of an imaging metrology apparatus, in accordance with an embodiment of the invention;

FIG. 3A is a schematic frontal view of a segmented overlay target, in accordance with an embodiment of the invention;

FIG. 3B is a schematic detail view of a part of a mask for patterning segmented bars in the overlay target of FIG. 3A, in accordance with an embodiment of the invention;

FIG. 4A is a schematic frontal view of a segmented frame-in-frame overlay target, in accordance with another embodiment of the invention;

FIG. 4B is a schematic detail view of a part of a mask for patterning segmented bars in the overlay target of FIG. 4A, in accordance with an embodiment of the invention.

DETAILED DESCRIPTION OF EMBODIMENTS

Overview

Figures 5A, 5B:
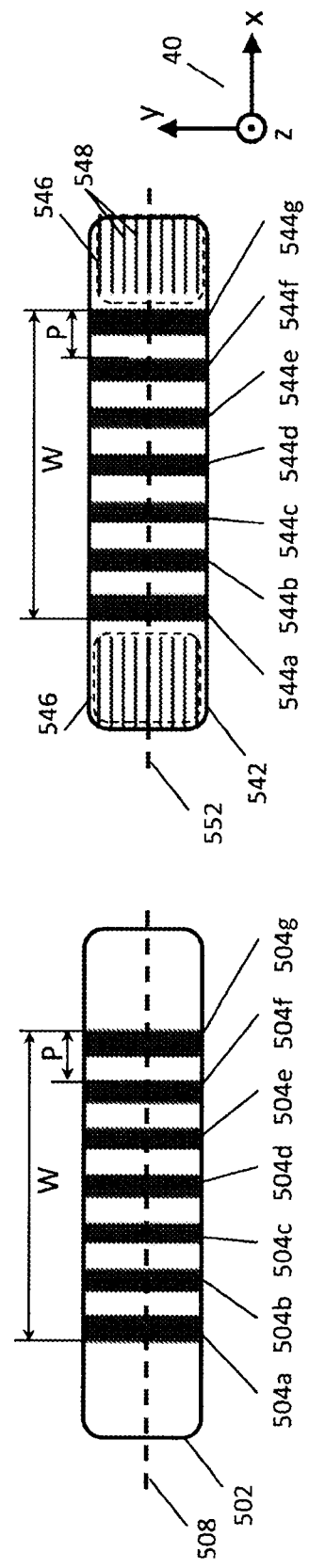
FIGS. 5A and 5B are simulated plots of aerial image amplitudes of segmented masks printed without and with sub-resolution assist features (SRAFs), respectively, in accordance with an embodiment of the invention.

Optical characteristics of overlay metrology tools that are known in the art set a lower limit to the feature sizes and periodicities of overlay targets. For example, for an overlay metrology tool having collection optics with a numerical aperture ($NA_{coll}$) of 0.9 and optical radiation with a wavelength $\lambda_{metr}$ of 500 nm of, the pitch P of a periodic target feature should exceed the value of $P=\lambda_{metr}/NA_{coll}\approx 550$ nm. (In the present description, $\lambda_{metr}$ is used to denote the wavelength of the optical overlay metrology tool, whereas $\lambda_{exp}$ is used to denote the wavelength of the exposure system.) For an overlay target to have an appreciable diffraction efficiency in such an overlay metrology tool, the feature sizes of such a target should be at least on the order of 100 nm. Both the pitch and the feature sizes of overlay targets are thus much larger than the critical dimensions of the semiconductor circuits, which are typically on the order of 10-14 nm using current technologies.

Because the dimensions of the overlay targets are so much greater than those of the circuit features, the target features in the photolithographic mask are segmented, i.e. divided into linear segments whose sizes are compatible with circuit features but not resolvable by the optics of the overlay metrology tool. Even so, optical aberrations of the photolithographic system may still shift the target features by a different amount from that experienced by the circuit features. This shift will give rise to an error in measurement, known as pattern placement error (PPE), between the overlay error measured by an optical metrology system and the actual overlay error of the circuit features. A source of this PPE is the difference between the respective line widths of the extreme segments of the segmented target feature. This difference can arise due to a differential shift between the so-called aerial images of the segments and the aerial image of the target feature as a whole, due to residual optical aberrations of the exposure system. Typical values of the line width differences are on the order of 1 nm, leading to values of PPE of the same order of magnitude.

The embodiments described herein address this problem by interleaving sub-resolution assist features (SRAFs) with the target features in the lithographic mask. (The term "interleaved," in the context of the present description and in the claims, means that at least one SRAF is contained between two adjoining target features, and/or at least one target feature is contained between two adjoining SRAFs.) The dimensions of the SRAFs are below the resolution limit of the exposure system, and thus the SRAFs are not patterned in the photoresist layer on the wafer. Interleaving of the SRAFs with the target features, however, reduces the amplitude variations in the aerial image at the edges of the target features. Reducing these amplitude variations leads to a reduction in the dimensional differences between the extreme segments of the target feature and hence alleviates the PPE.

In some embodiments, each SRAF comprises for example parallel, equispaced lines, wherein the pitch of the lines in the SRAF is below the resolution limit of the exposure system. The lines of the SRAF can be oriented in a direction that is perpendicular or otherwise non-parallel to the segments of a segmented target feature in order to avoid modulation and distortion of the aerial image of the segments. The inventors have found that application of SRAFs to segmented target features reduces the typical dimensional differences between the extreme segments from about 1 nm to about 0.1 nm, thus improving the accuracy of optical overlay error metrology. Resolution limits can be different for each system. For example, pitches less than approximately 60-70 nm are unresolved for an immersion scanner with illumination wavelength 193 nm and numerical aperture (NA) of approximately 1.4. Mask manufacture also can affect minimal pitch size, which may have a limit of approximately 20 nm. Thus, the resolution limit may include structures with pitch larger than approximately 20 nm and less than approximately 60 nm, a pitch larger than approximately 20 nm and less than approximately 70 nm, or other unresolved ranges depending on the system.

Thus, in the disclosed examples, a first film layer is deposited on a semiconductor substrate and a second film layer is deposited over the first film layer. The first and second film layers are patterned by projecting optical radiation onto the semiconductor substrate through at least one mask to create an overlay target having a specified geometrical form, using a photolithographic projection system having a predefined resolution limit. The mask contains target features having dimensions no less than the predefined resolution limit in an arrangement corresponding to the specified geometrical form of the overlay target. The mask further contains assist features, referred to herein as SRAFs, which are interleaved with the target features and have at least one assist feature dimension that is less than the predefined resolution limit. These assist features are useful, inter alia, in reducing PPE, as explained above.

Patterning and Metrology Systems

FIG. 1 is a schematic side view of an exposure system 20 for patterning a photoresist layer 22 on a semiconductor substrate 24, such as a silicon wafer, in accordance with an embodiment of the invention. Exposure system 20 is shown by way of example, and other sorts of exposure systems may alternatively be used.

Exposure system 20, representing in a simplified manner a scanner or a stepper, comprises an exposure light source 26, a mask stage 28, projection optics 30, a wafer stage 32, and an exposure system controller 34. Semiconductor substrate 24, having one or more process layers 38 and photoresist layer 22 deposited over its top surface, is positioned on wafer stage 32. The orientation of exposure system 20, as well as the orientation of the items in the figures hereinbelow, is referenced to Cartesian coordinates 40.

A mask 36, defining a pattern in photoresist layer 22, is positioned in mask stage 28. Mask 36 includes both patterns for forming features of electronic circuits and patterns for forming overlay targets, as will be detailed hereinbelow. As noted earlier, these latter patterns include target features having target feature dimensions no less than a predefined resolution limit of system 20 and assist features having at least one assist feature dimension that is less than this resolution limit. Different embodiments of the invention, such as those shown in FIGS. 3A/B and 4A/B, use masks with different features.

Exposure light source 26 emits optical radiation, indicated by arrows 42, to illuminate mask 36. The optical radiation typically comprises wavelengths in the UV or EUV spectral regime. Although the emitted optical radiation in the figure is shown as uniform and collimated radiation, it may alternatively comprise radiation with a different spatial and/or angular distribution.

Mask stage 28 comprises actuators, controlled by exposure system controller 34, which can move the stage (and thus mask 36) linearly in the x-, y-, and z-directions, as well as rotate the stage around the z-axis and tilt it around the x- and y-axes. Mask 36 typically comprises a substrate, such as quartz, that is transparent to the optical radiation emitted by exposure light source 26, with patterns formed on the substrate, in a thin film of suitable material, to modulate the amplitude and/or phase of the optical radiation transmitted by the mask.

Projection optics 30 are shown for the sake of simplicity as a single lens, but typically comprise multiple lenses and/or mirrors, whose positions and orientations may be controlled by exposure system controller 34 for optimal optical performance. The resolution limit of projection optics 30, and hence of exposure system 20, is defined by the minimum linewidth, known as the critical dimension $CD_{min}$, that the exposure system can pattern. This minimum linewidth is given approximately by $CD_{min}=k_1 \times \lambda_{exp}/NA_{proj}$, wherein $k_1$ (commonly called the $k_1$-factor) is a coefficient that encapsulates process-related factors and typically has a value of about 0.4. $\lambda_{exp}$ is the wavelength emitted by exposure light source 26, and $NA_{proj}$ is the numerical aperture of projection optics 30.

Wafer stage 32 comprises actuators, controlled by exposure system controller 34, which can move the stage (and thus semiconductor substrate 24) linearly in the x-, y-, and z-directions, as well as rotate the stage around the z-axis.

Exposure system controller 34 is coupled to light source 26, mask stage 28, projection optics 30, and wafer stage 32. Controller 34 typically comprises a programmable processor, which is programmed in software and/or firmware to carry out the functions that are described herein, along with suitable digital and/or analog interfaces for connection to the other elements of exposure system 20. Alternatively or additionally, controller 34 comprises hard-wired and/or programmable hardware logic circuits, which carry out at least some of the functions of the controller. Although controller 34 is shown in FIG. 1, for the sake of simplicity, as a single, monolithic functional block, in practice the controller may comprise multiple, interconnected control units, with suitable interfaces for receiving and outputting the signals that are illustrated in the figures and are described in the text.

For the purpose of patterning photoresist layer 22, exposure system controller 34 moves wafer stage 32 under projection optics 30 so that photoresist layer 22 on semiconductor substrate 24 is in a desired position and orientation with respect to the optics. Exposure light source 26 emits optical radiation to illuminate mask 36. The optical radiation impinging on mask 36 is transmitted and/or diffracted by the mask and projected toward projection optics 30, which focuses the radiation onto photoresist layer 22, thus exposing the photoresist. The spatial distribution of the intensity of the optical radiation illuminating photoresist 22 is termed an "aerial image."

Exposed photoresist layer 22 is developed to remove the exposed patterns. The displacements between the overlay target features in photoresist layer 22 and corresponding target features that were formed previously in the underlying process layer 38 are measured in order to assess the overlay errors between photoresist layer 22 and process layer 38, using an optical metrology tool as will be detailed hereinbelow. Provided that the overlay errors comply with preset tolerances, process layer 38 is modified by methods such as etching and ion bombardment to change the material properties and/or the topography of the process layer, while the parts of the process layer covered by remaining parts of photoresist layer 22 are not affected.

FIG. 2 is a schematic side view of an imaging metrology apparatus 50, in accordance with an embodiment of the invention. Apparatus 50 is shown by way of example for illustrating methods of overlay error metrology using overlay targets that are patterned in accordance with embodiments of the present invention. Alternatively, such targets may be used in other sorts of metrology systems.

Imaging metrology apparatus 50 comprises an imaging assembly 52, an illumination assembly 54, a metrology processor 56, and a table 58 on which semiconductor substrate, such as substrate 24 exposed by exposure system 20, is mounted. Imaging assembly 52 comprises an objective lens 60 with a numerical aperture of $NA_{coll}$, a cube beamsplitter 62, and an imaging lens 64. Imaging assembly 52 further comprises a two-dimensional sensor array 66, comprising for example, a complementary metal-oxide-semiconductor (CMOS) detector with a two-dimensional array of pixels 68. Imaging lens 64 images the top surface of semiconductor substrate 24 onto sensor array 66. Illumination assembly 54 comprises a light source 70, emitting optical radiation at a wavelength of $\lambda_{metr}$, and a lens 72. As noted earlier, the imaging resolution limit of metrology apparatus 50 is determined by the wavelength $\lambda_{metr}$ and the characteristics of imaging lens 64 and is typically on the order of at least several hundred nanometers.

Table 58 is located in proximity to objective lens 60, and comprises actuators, controlled by metrology processor 56, which can move the table linearly in the x-, y-, and z-directions, as well as rotate the table around the z-axis. Semiconductor substrate 24, having process layer 38 and photoresist layer 22 deposited over its top surface, is positioned on table 58. Photoresist layer 22 has been patterned by exposure system 20 as described hereinabove.

Metrology processor 56 is coupled to sensor array 66 and to table 58. Metrology processor 56 typically comprises a programmable processor, which is programmed in software and/or firmware to carry out the functions that are described herein, along with suitable digital and/or analog interfaces for connection to the other elements of apparatus 50. Alternatively or additionally, processor 56 comprises hard-wired and/or programmable hardware logic circuits, which carry out at least some of the functions of the processor. Although processor 56 is shown in FIG. 2, for the sake of simplicity, as a single, monolithic functional block, in practice the processor may comprise multiple, interconnected control units, with suitable interfaces for receiving and outputting the signals that are illustrated in the figures and are described in the text.

To capture an image of a metrology target in photoresist layer 22, semiconductor substrate 24 is positioned on table 58 and the table is moved so that the target is in the field of view (FOV) of objective lens 60. Light source 70 projects a beam of optical radiation to lens 72, which further projects the beam to cube beamsplitter 62. Beamsplitter 62 reflects the beam into objective lens 60, which projects the beam onto semiconductor substrate 24 illuminating the metrology target. The radiation impinging on semiconductor substrate 24 is reflected back to objective lens 60, and further focused by lens 64 onto sensor array 66.

Metrology processor 56 captures the image and processes it in order to measure the overlay error. Specifically, processor 56 processes images of metrology targets to find respective centers of symmetry in both x- and y-directions of the target features in the process layer and the photoresist layer. The two-dimensional displacement between the centers of symmetry is the overlay error.

Overlay Target Patterns and Masks

Reference is now made to FIGS. 3A and 3B, which schematically illustrate a segmented overlay target 100 and a detail of a mask 200 for patterning target 100 in photoresist layer 22, in accordance with an embodiment of the invention.

Overlay target 100 has the form of an AIM™ target, comprising four target features 102a, 102b, 102c, and 102d formed in process layer 38 (FIG. 1) and four target features 104a, 104b, 104c, and 104d formed in photoresist layer 22. Each of target features 104a, 104b, 104c, and 104d comprises four parallel, equispaced segmented bars. The widths of the linear segments making up each bar are compatible with the widths of the circuit features but not resolvable by an overlay metrology tool. The specific features of target 100 are shown by way of example, and the principles of the present embodiment may alternatively be applied, mutatis mutandis, to other target geometries.

For example, target feature 104a comprises bars 106a, 106b, 106c, and 106d, with each bar further segmented into seven linear segments 110a, 110b, 110c, 110d, 110e, 110f, and 110g. For the sake of clarity, the segmentation is not shown in the general view of target 100, but rather in an inset 108. Thus, the general view of target 100 is a represents the image of the target that an optical metrology tool would capture. (Alternatively, the target features may comprise a smaller or larger number of bars, and the bars may be segmented into a smaller or larger number of segments. AIM™ targets may alternatively comprise non-segmented bars.)

As noted earlier, typical widths of the four bars in each of target features 102a-102d and 104a-104d are on the order of hundreds of nanometers in order to enable resolving an optical image of target 100 captured by an optical overlay metrology tool. An example of the segmentation of three of the four bars of vertical target feature 104a (bars 106a, 106b, and 106c) is shown in an inset 108. (The terms "vertical" and "horizontal" are used to refer to the y- and x-axes of Cartesian coordinates 40, respectively.) Bar 106a is segmented into vertical segments 110a, 110b, 110c, 110d, 110e, 110f, and 110g of equal widths and spacings. The common width of segments 110a-110g is chosen so as to be compatible with circuit features in mask 36 but not to be resolvable by the overlay metrology tool (such as apparatus 50 in FIG. 2), while an image of the collective feature of the segments, bar 106a, may be captured by the tool. For example, the width of the segments may be chosen to be 10 nm or 20 nm, or any other suitable value that is compatible with the circuit features, while the collective width of the segments forms an optically resolvable bar.

Target features 104a-104d of target 100 are patterned by exposure system 20 through mask 200 in photoresist layer 22. (Target features 102a-102d of target 100 have been patterned in process layer 38 at a previous stage of the photolithographic process, using suitable patterns in a different mask.) Mask 200 comprises segmented vertical bars 202a, 202b, and 202c, and is used to pattern segmented vertical bars 106a, 106b, and 106c in inset 108. For example, segmented bar 202a comprises linear segments 204a, 204b, 204c, 204d, 204e, 204f, and 204g, which pattern the corresponding segments 110a, 110b, 110c, 110d, 110e, 110f, and 110g in segmented bar 106a.

In addition to comprising vertical segmented bars 202a, 202b, and 202c, mask 200 comprises SRAFs 206 interleaved on both sides of the segmented bars. Each SRAF in the pictured example comprises a linear grating comprising nine parallel equispaced bars 208, oriented in the horizontal direction (perpendicularly to the vertical segmented bars). The perpendicular orientation is useful in avoiding modulation and distortion of the aerial image of the segments. The widths and spacings of bars 208 of SRAFs 206 are selected so that they are below the resolution limit of exposure system 20, and thus are not patterned in photoresist layer 22. For example, the pitch of bars 208 may be less than 10 nm (meaning that the widths of the bars are less than 5 nm, below the resolution of exposure system 20). However, as will be further detailed hereinbelow, they lower the amplitude of the aerial image between the segmented features and thus reduce variations between the widths of the extreme segments 110a and 110g, typically to within 0.1 nm.

Reference is now made to FIGS. 4A and 4B, which schematically illustrate a segmented overlay target 300 and a detail of a mask 400 for patterning target 300 in photoresist layer 22, in accordance with another embodiment of the invention.

Overlay target 300 is a frame-in-frame target, comprising four segmented bars 302a, 302b, 302c, and 302d formed in process layer 38 (FIG. 1) and four segmented bars 304a, 304b, 304c, and 304d formed in photoresist layer 22. Each bar in the pictured example is segmented into seven linear segments 308a, 308b, 308c, 308d, 308e, 308f, and 308g. (The bars may alternatively be segmented into other numbers of segments. Bars of frame-in-frame targets may alternatively be unsegmented.) The segments of the bars are compatible with the circuit features in mask 400 but are not resolvable by an overlay metrology tool, such as apparatus 50 (FIG. 2).

For the sake of clarity, the segmentation of bars 304 is not shown in the general view of target 300, but rather in an inset 306. Thus, the general view of target 300 is a schematic representation of an image that an optical metrology tool, such as apparatus 50, would capture. The overlay error between process layer 38 and photoresist layer 22 is measured in apparatus 50 by capturing an image of target 300 and processing the image to find respective centers of symmetry in both x- and y-directions of the target features in the process layer and the photoresist layer. The two-dimensional displacement between the centers of symmetry is the overlay error.

As previously described, the typical widths of bars 302a-302d and 304a-304d are on the order of hundreds of nanometers in order to enable apparatus 50 to resolve an optical image of target 300. An example of the segmentation of the bars is shown using a part of bar 304d shown in an inset 306. Bar 304d, oriented in the vertical direction, is segmented into linear segments 308a, 308b, 308c, 308d, 308e, 308f, 308g of equal widths and spacings. The common width of segments 308a-308g is chosen so as to be compatible with circuit features but not resolvable by an overlay metrology tool, such as apparatus 50 (FIG. 2), while an image of the collective feature of the segments, bar 304d, may be captured by the tool. Similarly to target 100 (FIG. 2A), the width of the segments may be chosen to be 10 nm or 20 nm, for example, or any other suitable value that is compatible with the circuit features and that, as a collective of the segments, forms an optically resolvable bar.

Bars 304a-304d of target 300 are patterned by exposure system 20 through mask 400 in photoresist layer 22. (Bars 302a-302d of target 300 have been patterned in process layer 38 at a previous stage of the photolithographic process, using suitable patterns in a different mask.) Mask 400 comprises vertical linear segments 402a, 402b, 402c, 402d, 402e, 402f, and 402g, which pattern the corresponding segments 308a, 308b, 308c, 308d, 308e, 308f, 308g in inset 306.

In addition to vertical segments 402a-402g, mask 400 comprises SRAFs 404a and 404g adjacent to respective segments 402a and 402g. Each SRAF comprises a linear grating comprising, in the pictured example, nine parallel equispaced bars 406, oriented in the horizontal direction (perpendicularly to the segmented bars). Similarly to SRAFs 206 (FIG. 2B), the widths and spacings of bars 406 are selected so that they are below the resolution limit of exposure system 20, and thus are not patterned into photoresist layer 22. However, as will be further detailed hereinbelow, they lower the amplitude of the aerial image adjacent to the extreme segments 308a and 308g and thus reduce variations between the widths of these extreme segments.

FIGS. 5A and 5B respectively show simulated plots 500 and 540 of aerial image amplitudes together with details of segmented masks 502 and 542 without and with SRAFs for patterning a segmented bar, in accordance with an embodiment of the invention. The simulations were performed using a Prolith™ lithography simulation tool by FLA Corporation. Cartesian coordinates 40 are used as a reference for masks 502 and 542. In FIG. 5A, the y-axis ranges from 0.0 to 0.4.

As shown in FIG. 5A, mask 502 comprises seven vertical bars 504a, 504b, 504c, 504d, 504e, 504f, and 504g with a pitch P, for patterning seven segments in photoresist layer 22, without SRAFs. Plot 500 comprises a curve 506 showing the amplitude of an aerial image generated by exposure system 20 for exposing photoresist layer 22 using mask 502. Curve 506 is computed along a line 508 across mask 502, as projected onto photoresist layer 22, and contains seven troughs 510a, 510b, 510c, 510d, 510e, 510f, and 510g, corresponding to the seven segments 504a, 504b, 504c, 504d, 504e, 504f, and 504g. A horizontal line 512 denotes the patterning threshold of the photoresist development process, i.e., the amplitude of the aerial image above which the exposed photoresist becomes soluble. Thus, troughs 510a-510g will, after photoresist development, form the seven segments of a segmented bar with a width W, similar to bar 304d (FIG. 4A).

As the optical aberrations of optical systems (such as projection optics 30 in exposure system 20) are typically low at the center of the optical aperture and increase towards its edges, these aberrations tend to shift the patterned features that are transmitted through the edges of the aperture more than those transmitted near the center. Thus, in the present example, troughs 510a-510g are shifted in the x-direction relative to the aerial image of the overall segmented bar, whose width W is dominated by steep slopes 514a and 514b at either side of curve 506. Assuming that the optical aberrations shift troughs 510a-510g in the positive x-direction, as shown by an arrow 516, relative to the aerial image of the bar, trough 510g moves nearer to slope 514b, whereas trough 510a moves away from slope 514a. These shifts have the effect of narrowing trough 510g but widening trough 510a, thus causing the segment patterned by trough 510g to be slightly narrower than the segment patterned by trough 510a. The resulting difference ΔCD between the widths of the extreme segments of the patterned segmented bar will lead to an error in the measured overlay error due to PPE.

As shown in FIG. 5B, mask 542 comprises seven vertical bars 544a, 544b, 544c, 544d, 544e, 544f, and 544g with a pitch P, for patterning seven segments in photoresist layer 22. The y-axis in FIG. 5B ranges from 0.0 to 0.5. Unlike mask 502, mask 542 also comprises two SRAFs 546, each comprising nine parallel equispaced lines 548 in the present example, oriented perpendicularly to vertical bars 544a-544g. Similarly to mask 400, the widths and spacings of lines 548 are selected so that they are below the resolution limit of exposure system 20, and thus are not patterned into photoresist layer 22.

Similarly to FIG. 5A, plot 540 comprises a curve 550 showing the amplitude of an aerial image generated by exposure system 20 for exposing photoresist layer 22 using mask 542. Curve 550 is computed along a line 552 of section 542, as projected onto photoresist layer 22, and shows, similarly to curve 506, seven troughs 554a, 554b, 554c, 554d, 554e, 554f, and 554g, corresponding to the seven segments 544a, 544b, 544c, 544d, 544e, 544f, and 544g. A horizontal line 556 denotes the patterning threshold of the photoresist development process, which is approximately the same value as horizontal line 512. Thus, similarly to FIG. 5A, troughs 554a-554g will, after photoresist development, form the seven segments of a segmented bar with a width W, similar to bar 304d.

Troughs 554a-554g are shifted, similarly to troughs 510a-510g, due to the optical aberrations of projection optics 30, as shown by an arrow 558. However, SRAFs 546 scatter a part of the optical radiation exposing photoresist layer 22 away from the area adjacent to the segmented bar, thus lowering the amplitude of the aerial image outside troughs 510a-510g and reducing aerial image amplitude slopes 560a and 560b adjacent to troughs 554a and 554g. (To appreciate the reduction of slopes 560a and 560b as compared to slopes 514a and 514b, note the difference in the image amplitude scales between plots 500 and 540.) Although the image amplitude is still sufficient to expose photoresist layer 22 outside troughs 554a-554g, the effect of slopes 560a and 560b on the extreme troughs 554a and 554g is reduced, thus reducing the variation in widths ΔCD between the extreme segments of the patterned bar and consequently reducing the PPE.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for semiconductor metrology, comprising:
    depositing a first film layer on a semiconductor substrate and a second film layer overlying the first film layer; and
    patterning the first and second film layers to create an overlay target having a specified geometrical form by using a projection system having a predefined resolution limit to project optical radiation onto the semiconductor substrate through at least one mask, which contains:
        target features having target feature dimensions no less than the predefined resolution limit in an arrangement corresponding to the specified geometrical form of the overlay target; and
        assist features interleaved with the target features and having at least one assist feature dimension that is less than the predefined resolution limit.

2. The method according to claim 1, wherein the specified geometrical form comprises multiple parallel, equispaced bars.

3. The method according to claim 1, wherein the specified geometrical form comprises a frame-in-frame target.

4. The method according to claim 1, wherein the target features comprise multiple parallel linear segments oriented along a first direction, and wherein the assist features comprise linear gratings oriented along a second direction, which is not parallel with the first direction.

5. The method according to claim 4, wherein the second direction is perpendicular to the first direction.

6. The method according to claim 4, wherein the at least one mask further comprises circuit features having a predefined critical dimension, and wherein the linear segments have respective widths equal to the predefined critical dimension.

7. The method according to claim 4, wherein the multiple parallel linear segments are grouped together to define at least one bar, and wherein the assist features are disposed on both sides of the at least one bar.

8. The method according to claim 7, wherein the multiple parallel linear segments are grouped together to define multiple parallel bars, and wherein the assist features are disposed between the multiple parallel bars.

9. The method according to claim 4, wherein the linear gratings of the assist features have a pitch less than 10 nm.

10. A mask for patterning a semiconductor wafer in a photolithographic projection system having a predefined resolution limit, the mask comprising:
    a transparent substrate; and
    features disposed on the transparent substrate, including:
        target features having target feature dimensions no less than the predefined resolution limit in an arrangement corresponding to a specified geometrical form of an overlay target; and
        assist features interleaved with the target features and having at least one assist feature dimension that is less than the predefined resolution limit.

11. The mask according to claim 10, wherein the specified geometrical form comprises multiple parallel, equispaced bars.

12. The mask according to claim 10, wherein the specified geometrical form comprises a frame-in-frame target.

13. The mask according to claim 10, wherein the target features comprise multiple parallel linear segments oriented along a first direction, and wherein the assist features comprise linear gratings oriented along a second direction, which is not parallel with the first direction.

14. The mask according to claim 13, wherein the second direction is perpendicular to the first direction.

15. The mask according to claim 13, wherein the features on the transparent substrate further comprise circuit features having a predefined critical dimension, and wherein the linear segments have respective widths equal to the predefined critical dimension.

16. The mask according to claim 13, wherein the multiple parallel linear segments are grouped together to define at least one bar, and wherein the assist features are disposed on both sides of the at least one bar.

17. The mask according to claim 16, wherein the multiple parallel linear segments are grouped together to define multiple parallel bars, and wherein the assist features are disposed between the multiple parallel bars.

18. The mask according to claim 13, wherein the linear gratings of the assist features have a pitch less than 10 nm.

* * * * *